United States Patent
Suzuki

(10) Patent No.: US 9,071,365 B2
(45) Date of Patent: Jun. 30, 2015

(54) OPTICAL SIGNAL PROCESSING DEVICE AND OPTICAL SIGNAL PROCESSING METHOD

(75) Inventor: Yasuyuki Suzuki, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 13/980,851

(22) PCT Filed: Dec. 22, 2011

(86) PCT No.: PCT/JP2011/007233
§ 371 (c)(1),
(2), (4) Date: Jul. 19, 2013

(87) PCT Pub. No.: WO2013/046284
PCT Pub. Date: Apr. 4, 2013

(65) Prior Publication Data
US 2013/0294784 A1 Nov. 7, 2013

(30) Foreign Application Priority Data
Sep. 26, 2011 (JP) ................................. 2011-208714

(51) Int. Cl.
*H04B 10/06* (2006.01)
*H04B 10/61* (2013.01)
(Continued)

(52) U.S. Cl.
CPC ............. *H04B 10/6165* (2013.01); *H03F 3/08* (2013.01); *H03F 3/087* (2013.01); *H03F 3/45179* (2013.01); *H03F 3/45183* (2013.01); *H03F 3/45632* (2013.01);
(Continued)

(58) Field of Classification Search
None
See application file for complete search history.

(56) References Cited

U.S. PATENT DOCUMENTS

2010/0260504 A1   10/2010   Takahara
2010/0284703 A1   11/2010   Suzuki
(Continued)

FOREIGN PATENT DOCUMENTS

| JP | 62-15909 A | 1/1987 |
|---|---|---|
| JP | 2000-174567 A | 6/2000 |
| JP | 2004-179998 A | 6/2004 |
| JP | 2010-028795 A | 2/2010 |
| JP | 2010-251851 A | 11/2010 |
| WO | WO 2009/069814 A1 | 6/2009 |
| WO | WO 2009/153838 A1 | 12/2009 |

OTHER PUBLICATIONS

International Search Report dated Mar. 13, 2012 in PCT/JP2011/007233, with English translation thereof.

*Primary Examiner* — Ken Vanderpuye
*Assistant Examiner* — David Lambert
(74) *Attorney, Agent, or Firm* — McGinn IP Law Group, PLLC.

(57) ABSTRACT

An optical hybrid (100) generates a first optical signal by causing local light to interfere with a received optical signal which is received from an outside with a first phase difference. In addition, the optical hybrid (100) generates a second optical signal by causing the local light to interfere with the received optical signal with a second phase difference shifted by π from the first phase difference. Two photoelectric conversion elements (150) photoelectrically convert the first optical signal and the second optical signal, respectively, and generate a first electrical signal and a second electrical signal. A differential trans-impedance amplifier (200) includes a direct-current component correction unit (210), a trans-impedance circuit (240), and a variable gain amplifier (250). The direct-current component correction unit (210) reduces a difference of the magnitude of a direct-current component of the first electrical signal and the magnitude of a direct-current component of the second electrical signal.

24 Claims, 18 Drawing Sheets

(51) Int. Cl.
*H03F 3/08* (2006.01)
*H03F 3/45* (2006.01)
(52) U.S. Cl.
CPC ............... *H03F 2203/45702* (2013.01); *H03F 2203/45722* (2013.01); *H03F 2200/336* (2013.01)

(56) References Cited

U.S. PATENT DOCUMENTS

2011/0318015 A1* 12/2011 Sugimoto .................. 398/116
2012/0002921 A1* 1/2012 Jeong ........................ 385/32

* cited by examiner

US 9,071,365 B2

OPTICAL SIGNAL PROCESSING DEVICE AND OPTICAL SIGNAL PROCESSING METHOD

TECHNICAL FIELD

The present invention relates to an optical signal processing device that processes an optical signal, and an optical signal processing method.

BACKGROUND ART

With the spread of the Internet, an increase in the capacity of an optical communication system has progressed. For example, in trunk systems, researches for transmitting signals at a rate exceeding 40 Gbit/s per wavelength have been performed. When a bit rate per wavelength is made high, the deterioration of signal quality increases due to a decrease in optical signal-to-noise ratio (OSNR) resistance, and waveform distortion caused by wavelength dispersion of a transmission channel, polarization mode dispersion, a non-linear effect, and the like.

For this reason, in recent years, digital coherent reception systems having high OSNR resistance and waveform distortion resistance have attracted attention (see, for example, Patent Documents 1 and 2). In the digital coherent reception systems, light intensity information and phase information are extracted from a received signal, and demodulation is performed by a digital signal processing circuit. In the digital coherent reception systems, an improvement in the OSNR resistance by coherent reception and a correction of the waveform distortion by the digital signal processing circuit are realized, and thus even when signals are transmitted at a rate exceeding 40 Gbit/s, high reliability is achieved.

RELATED DOCUMENT

Patent Document

[Patent Document 1] Pamphlet of International Publication WO 09/069,814

[Patent Document 2] Japanese Unexamined Patent Application Publication No. 2010-028795

DISCLOSURE OF THE INVENTION

In a digital coherent reception device, the common mode rejection ratio (CMRR) of a photodiode to an optical input is one of the most important factors having an influence on performance. In addition, in an optical signal reception device, it is also important to increase a dynamic range.

An object of the invention is to provide an optical signal processing device and an optical signal processing method, which are capable of suppressing an increase in the CMRR. In addition, another object of the invention is to provide an optical signal processing device which is capable of increasing a dynamic range.

According to the invention, there is provided an optical signal processing device including: a first optical signal generation unit that generates a first optical signal by causing a received optical signal which is received from an outside and a local optical signal to interfere with each other with a first phase difference; a second optical signal generation unit that generates a second optical signal by causing the received optical signal and the local optical signal to interfere with each other with a second phase difference shifted by $\pi$ from the first phase difference; a first photoelectric conversion element that converts the first optical signal into a first electrical signal; a second photoelectric conversion element that converts the second optical signal into a second electrical signal; a direct-current component correction unit that reduces a difference between a magnitude of a direct-current component of the first electrical signal and a magnitude of a direct-current component of the second electrical signal; and a differential trans-impedance circuit into which the first electrical signal and the second electrical signal, which have been corrected by the direct-current component correction, unit are input.

According to the invention, there is provided an optical signal processing device including: a first optical signal processing unit that generates a first digital signal by causing a received optical signal which is received from an outside and a local optical signal to interfere with each other under a first condition; a second optical signal processing unit that generates a second digital signal by causing the received optical signal and the local optical signal to interfere with each other under a second condition; and a digital processing unit that processes the first digital signal and the second digital signal and extracts a signal included in the received optical signal, wherein the first optical signal processing unit includes: a first optical signal generation unit that generates a first optical signal by causing the received optical signal and the local optical signal to interfere with each other with a same phase; a second optical signal generation unit that generates a second optical signal by causing the received optical signal and the local optical signal to interfere with each other with a phase difference of $\pi$; a first photoelectric conversion element that converts the first optical signal into a first electrical signal; a second photoelectric conversion element that converts the second optical signal into a second electrical signal; a first direct-current component correction unit that reduces a difference between a direct-current component of the first electrical signal and a direct-current component of the second electrical signal; a differential first trans-impedance amplifier into which the first electrical signal and the second electrical signal, which have been corrected by the direct-current component correction unit, are input; and a first AD conversion unit that converts an output of the first trans-impedance amplifier into the first digital signal, and the second optical signal processing unit includes: a third optical signal generation unit that generates a third optical signal by causing the received optical signal and the local optical signal to interfere with each other with a phase difference of $\pi/2$; a fourth optical signal generation unit that generates a fourth optical signal by causing the received optical signal and the local optical signal to interfere with each other with a phase difference of $3\pi/2$; a third photoelectric conversion element that converts the third optical signal into a third electrical signal, a fourth photoelectric conversion element that converts the fourth optical signal into a fourth electrical signal; a second direct-current component correction unit that reduces a difference between a direct-current component of the third electrical signal and a direct-current component of the fourth electrical signal; a differential second trans-impedance amplifier into which the third electrical signal and the fourth electrical signal, which have been corrected by the direct-current component correction unit, are input; and a second AD conversion unit that converts an output of the second trans-impedance amplifier into the second digital signal.

According to the invention, there is provided an optical signal processing method including: generating a first optical signal by causing a received optical signal which is received from an outside and a local optical signal which is output from a light source on a receiving side to interfere with each other with a first phase difference; generating a second optical signal by causing the received optical signal and the local optical signal to interfere with each other with a second phase difference shifted by π from the first phase difference; converting the first optical signal into a first electrical signal; converting the second optical signal into a second electrical signal; and reducing a difference between a direct-current component of the first electrical signal and a direct-current component of the second electrical signal, and then inputting the first electrical signal and the second electrical signal to a differential trans-impedance circuit.

According to the invention, there is provided an optical signal processing device including: a first optical signal generation unit that generates a first optical signal by causing a received optical signal which is received from an outside and a local optical signal to interfere with each other with a first phase difference; a second optical signal generation unit that generates a second optical signal by causing the received optical signal and the local optical signal to interfere with each other with a second phase difference shifted by π from the first phase difference; a first photoelectric conversion element that converts the first optical signal into a first electrical signal; a second photoelectric conversion element that converts the second optical signal into a second electrical signal; a direct-current component correction unit that reduces a direct-current component of the first electrical signal and a direct-current component of the second electrical signal; and a differential trans-impedance circuit into which the first electrical signal and the second electrical signal, which have been corrected by the direct-current component correction unit, are input.

According to the invention, there is provided a trans-impedance amplifier including: a direct-current component correction unit that reduces a difference between a magnitude of a direct-current component of a first electrical signal and a magnitude of a direct-current component of a second electrical signal; and a differential trans-impedance circuit into which the first electrical signal and the second electrical signal, which have been corrected by the direct-current component correction unit, are input.

According to the invention, there is provided an optical signal processing device including: a first optical signal processing unit that generates a first digital signal by causing a received optical signal which is received from an outside and a local optical signal to interfere with each other under a first condition; a second optical signal processing unit that generates a second digital signal by causing the received optical signal and the local optical signal to interfere with each other under a second condition; and a digital processing unit that processes the first digital signal and the second digital signal and extracts a signal included in the received optical signal, wherein the first optical signal processing unit includes: a first optical signal generation unit that generates a first optical signal by causing the received optical signal and the local optical signal to interfere with each other with a same phase; a second optical signal generation unit that generates a second optical signal by causing the received optical signal and the local optical signal to interfere with each other with a phase difference of n; a first photoelectric conversion element that converts the first optical signal into a first electrical signal; a second photoelectric conversion element that converts the second optical signal into a second electrical signal; a first direct-current component correction unit that reduces a direct-current component of the first electrical signal and reduces a direct-current component of the second electrical signal; a differential first trans-impedance amplifier to which the first electrical signal and the second electrical signal after corrected by the direct-current component correction unit are input; and a first AD conversion unit that converts an output of the first trans-impedance amplifier into the first digital signal; and the second optical signal processing unit includes: a third optical signal generation unit that generates a third optical signal by causing the received optical signal and the local optical signal to interfere with each other with a phase difference of $\pi/2$; a fourth optical signal generation unit that generates a fourth optical signal by causing the received optical signal and the local optical signal to interfere with each other with a phase difference of $3\pi/2$; a third photoelectric conversion element that converts the third optical signal into a third electrical signal, a fourth photoelectric conversion element that converts the fourth optical signal into a fourth electrical signal; a second direct-current component correction unit that reduces a direct-current component of the third electrical signal, and reduces a direct-current component of the fourth electrical signal; a differential second trans-impedance amplifier to which the third electrical signal and the fourth electrical signal after corrected by the direct-current component correction unit are input; and a second AD conversion unit that converts an output of the second trans-impedance amplifier into the second digital signal.

According to the invention, it is possible to suppress an increase in the CMRR of an optical signal processing device. In addition, according to the invention, it is possible to increase a dynamic range of an optical signal processing device.

BRIEF DESCRIPTION OF THE DRAWINGS

The above-mentioned objects, other objects, features and advantages will be made clearer with the preferred embodiments described below and the following accompanying drawings.

DESCRIPTION OF EMBODIMENTS

Figure 1:
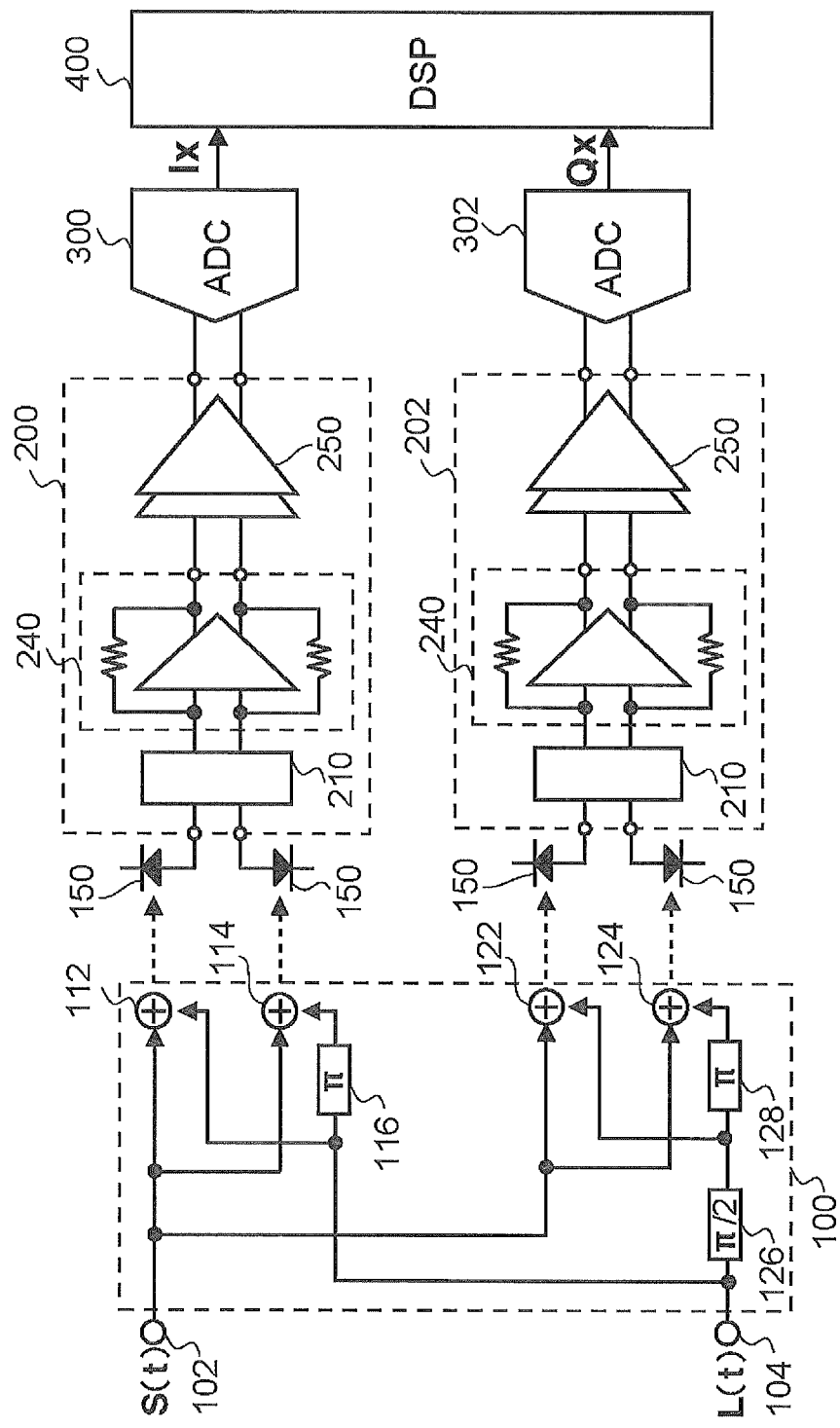
FIG. 1 is a block diagram illustrating a configuration of an optical signal processing device according to a first embodiment.

Hereinafter, embodiments of the present invention will be described with reference to the accompanying drawings. In all the drawings, the same elements are referenced by the same reference numerals and descriptions thereof will not be repeated.

First Embodiment

FIG. 1 is a block diagram illustrating a configuration of an optical signal processing device 10 according to a first embodiment. The optical signal processing device 10 is a device that receives an optical signal, for example, using a digital coherent scheme. The optical signal processing device 10 includes an optical hybrid 100, four photoelectric conversion elements 150, differential trans-impedance amplifiers 200 and 202, two AD conversion units 300, and a digital signal processing unit 400.

An optical signal received from the outside is split into an X polarized wave and a Y polarized wave by a polarization beam splitter before the signal is input to the optical signal processing device 10. Either the X polarized wave or the Y polarized wave is input into the optical signal processing device 10. The optical signal processing device 10 splits the X polarized wave or the Y polarized wave of the received optical signal which is input thereto, into an optical signal for an in-phase baseband signal (I) and an optical signal for a quadrature baseband signal (Q). Both the optical signal for an in-phase baseband signal (I) and the optical signal for a quadrature baseband signal (Q) are polarized, and their polarization directions are orthogonal. The differential trans-impedance amplifiers 200 and 202, and the AD conversion unit 300 perform a coherent detection (for example, homodyne detection or heterodyne detection) on the optical signal for an in-phase baseband signal (I) and the optical signal for a quadrature baseband signal (Q), and convert these optical signals into an in-phase baseband signal (I) and a quadrature baseband signal (Q). The digital signal processing unit 400 reproduces a transmitted multilevel modulation optical signal from the in-phase baseband signal and the quadrature baseband signal, and demodulates this multilevel modulation optical signal.

The optical hybrid 100 generates a first optical signal by causing local light to interfere with the X polarized wave (or Y polarized wave) of the optical signal received from the outside with a first phase difference. In addition, the optical hybrid 100 generates a second optical signal by causing the local light to interfere with the X polarized wave (or Y polarized wave) of the received optical signal with a second phase difference shifted by $\pi$ from the first phase difference.

Specifically, the optical hybrid 100 includes optical mixers 112 (first optical signal generation unit), 114 (second optical signal generation unit), 122 (third optical signal generation unit), and 124 (fourth optical signal generation unit), and optical phase shifters 116, 126, and 128. The X polarized wave (or Y polarized wave) of the received optical signal is input into each of the optical mixers 112, 114, 122, and 124. The local light is input into the optical mixer 112 without passing through any of the phase shifters. The local light is input into the optical mixer 114 through the optical phase shifter 116. The optical phase shifter 116 shifts the phase of the local light by n. The local light is input into the optical mixer 122 through the optical phase shifter 126. The optical phase shifter 126 shifts the phase of the local light by $\pi/2$ in the same direction as that of the optical phase shifter 116. The local light is input into the optical mixer 124 through the optical phase shifter 126 and the optical phase shifter 126. The optical phase shifter 128 shifts the phase of the local light by $\pi$ in the same direction as that of the optical phase shifter 126.

The optical mixer 112 generates a first optical signal by causing the X polarized wave (or Y polarized wave) of the received optical signal and the local light to interfere with each other in the same phase, and the optical mixer 114 generates a second optical signal by causing the X polarized wave (or Y polarized wave) of the received optical signal and the local light to interfere with each other with a phase difference of n. The optical mixer 122 generates a third optical signal by causing the X polarized wave (or Y polarized wave) of the received optical signal and the local light to interfere with each other with a phase difference of $\pi/2$, and the optical mixer 124 generates a fourth optical signal by causing the X polarized wave (or Y polarized wave) of the received optical signal and the local light to interfere with each other with a phase difference of $3\pi/2$. The first optical signal and the second optical signal form a set of signals, and the third optical signal and the fourth optical signal also form a set of signals.

Four photoelectric conversion elements 150 photoelectrically convert the first optical signal, the second optical signal, the third optical signal, and the fourth optical signal, and generate a first electrical signal, a second electrical signal, a third electrical signal, and a fourth electrical signal, respectively. The photoelectric conversion element 150 is, for example, a photodiode. The first electrical signal and the second electrical signal are input into the differential trans-impedance amplifier 200, and the third electrical signal and the fourth electrical signal are input into the differential trans-impedance amplifier 202.

The differential trans-impedance amplifier 200 includes a direct-current component correction unit 210, a trans-impedance circuit 240, and a variable gain amplifier 250. The direct-current component correction unit 210 reduces the difference between the magnitude of a direct-current component of the first electrical signal and the magnitude of a direct-current component of the second electrical signal. The details of the configuration of the direct-current component correction unit 210 will be described later. The first electrical signal and the second electrical signal, the direct-current components of which have been corrected by the direct-current component correction unit 210, are input into the trans-impedance circuit 240. The variable gain amplifier 250 amplifies the magnitude of an output of the trans-impedance circuit 240, and outputs the amplified output to the AD conversion unit 300.

Meanwhile, the differential trans-impedance amplifier 202 also includes the direct-current component correction unit 210, the trans-impedance circuit 240, and the variable gain amplifier 250. The differential trans-impedance amplifier 202 has the same function as that of the differential trans-impedance amplifier 200, except that the third electrical signal is input thereto instead of the first electrical signal, and that the fourth electrical signal is input thereto instead of the second electrical signal.

The AD conversion unit 300 converts two analog signals output from the differential trans-impedance amplifier 200 into a digital signal. This digital signal is an in-phase baseband signal.

The AD conversion unit 302 converts two analog signals output from the differential trans-impedance amplifier 202 into a digital signal. This digital signal is a quadrature baseband signal.

Meanwhile, when photoelectric currents of two photoelectric conversion elements 150 are set to $I_1$ and $I_2$, the common mode rejection ratio (CMRR) is expressed by the following Expression (1).

$$CMRR = 20\ \log\frac{|I_1 - I_2|}{I_1 + I_2} \qquad (1)$$

Herein, the reason that the CMRR influences the accuracy of signal processing of a digital coherent scheme will be described by taking an example of a quadrature phase shift keying (QPSK) optical signal. As mentioned above, in the optical hybrid 100, the received optical signal input into a first input unit 102 is converted into the first optical signal, the second optical signal, the third optical signal, and the fourth optical signal. The received optical signal input into the first input unit 102 is expressed by the following Expression (2), and the local light is expressed by the following Expression (3).

$$A(t)e^{j\omega t + j\phi(t)} \qquad (2)$$

$$L(t) = Be^{j\omega t} \qquad (3)$$

Meanwhile, $\omega_1$ is the frequency of the received optical signal, and $\omega$ is the frequency of the local light. Here, $\phi$ is a phase. In a case of QPSK, the relation of $\phi=0$ is established in the generation of the first optical signal, the relation of $\phi=\pi$ is established in the generation of the second optical signal, the relation of $\phi=\pi/2$ is established in the generation of the third optical signal, and the relation of $\phi=3\pi/2$ is established in the generation of the fourth optical signal.

Here, since the relation of $\omega_1=\omega$ is established, the first optical signal is expressed by the following Expression (4), the second optical signal is expressed by the following Expression (5), the third optical signal is expressed by the following Expression (6), and the fourth optical signal is expressed by the following Expression (7).

$$|S(t)+L(t)|^2 = a\{A(t)^2+B^2+2A(t)B\cos(\phi(t))\} \qquad (4)$$

$$|S(t)-L(t)|^2 = b\{A(t)^2+B^2-2A(t)B\cos(\phi(t))\} \qquad (5)$$

$$|S(t)+L(t)|^2 = c\{A(t)^2+B^2-2A(t)B\sin(\phi(t))\} \qquad (6)$$

$$|S(t)-L(t)|^2 = d\{A(t)^2+B^2+2A(t)B\sin(\phi(t))\} \qquad (7)$$

Herein, a, b, c, and d are coefficients caused by the quantum efficiency of the photoelectric conversion element 150 or the loss in the optical hybrid 100. In each of Expressions (4) to (7), a first term and a second term are DC components (offset components), and a third term is phase information of a signal.

The outputs of the trans-impedance circuit 240 of the differential trans-impedance amplifier 200 are expressed by the following Expressions (8) and (9). In addition, the outputs of the trans-impedance circuit 240 of the differential trans-impedance amplifier 202 are expressed by the following Expressions (10) and (11).

$$|S(t)+L(t)|^2-(|S(t)-L(t)|^2)=(a-b)\{A(t)^2+B^2\}+2(a+b)A(t)B\cos(\phi(t)) \qquad (8)$$

$$|S(t)-L(t)|^2-(|S(t)+L(t)|^2)=(b-a)\{A(t)^2+B^2\}+2(b+a)A(t)B\cos(\phi(t)) \qquad (9)$$

$$|S(t)+L(t)|^2-(|S(t)+L(t)|^2)=(c-d)\{A(t)^2+B^2\}-2(c+d)4A(t)B\sin(\phi(t)) \qquad (10)$$

$$|S(t)-L(t)|^2-(|S(t)+L(t)|^2)=(d-c)\{A(t)^2+B^2\}-2(d+c)4A(t)B\sin(\phi(t)) \qquad (11)$$

The differential signals of Expressions (8) and (9) are input into the variable gain amplifier 250 of the differential trans-impedance amplifier 200. In addition, the differential signals of Expressions (10) and (11) are input into the variable gain amplifier 250 of the differential trans-impedance amplifier 200.

Herein, since the light intensity $B^2$ of the local light is more than 10 times the intensity $A^2$ of the received optical signal, $B^2$ becomes dominant in Expressions (8) to (11). For this reason, when a difference occurs between the coefficients a and b of Expressions (8) and (9), the DC level of the output signal of the trans-impedance circuit 240 of the differential trans-impedance amplifier 200 changes considerably. In addition, when a difference occurs between the coefficients c and d of Expressions (10) and (11), the DC level of the output signal of the trans-impedance circuit 240 of the differential trans-impedance amplifier 202 changes considerably. For this reason, when the CMRR is insufficient, the accuracy of waveform distortion equalization by the variable gain amplifier 250 or the digital signal processing unit 400 is deteriorated.

On the other hand, in the embodiment, the direct-current component correction unit 210 reduces the difference between the magnitude of the direct-current component of the first electrical signal and the magnitude of the direct-current component of the second electrical signal (or difference between the magnitude of the direct-current component of the third electrical signal and the magnitude of the direct-current component of the fourth electrical signal). Therefore, an increase in the CMRR is suppressed, and thus the deterioration in the accuracy of signal processing by the optical signal processing device 10 can be suppressed.

Figure 2:
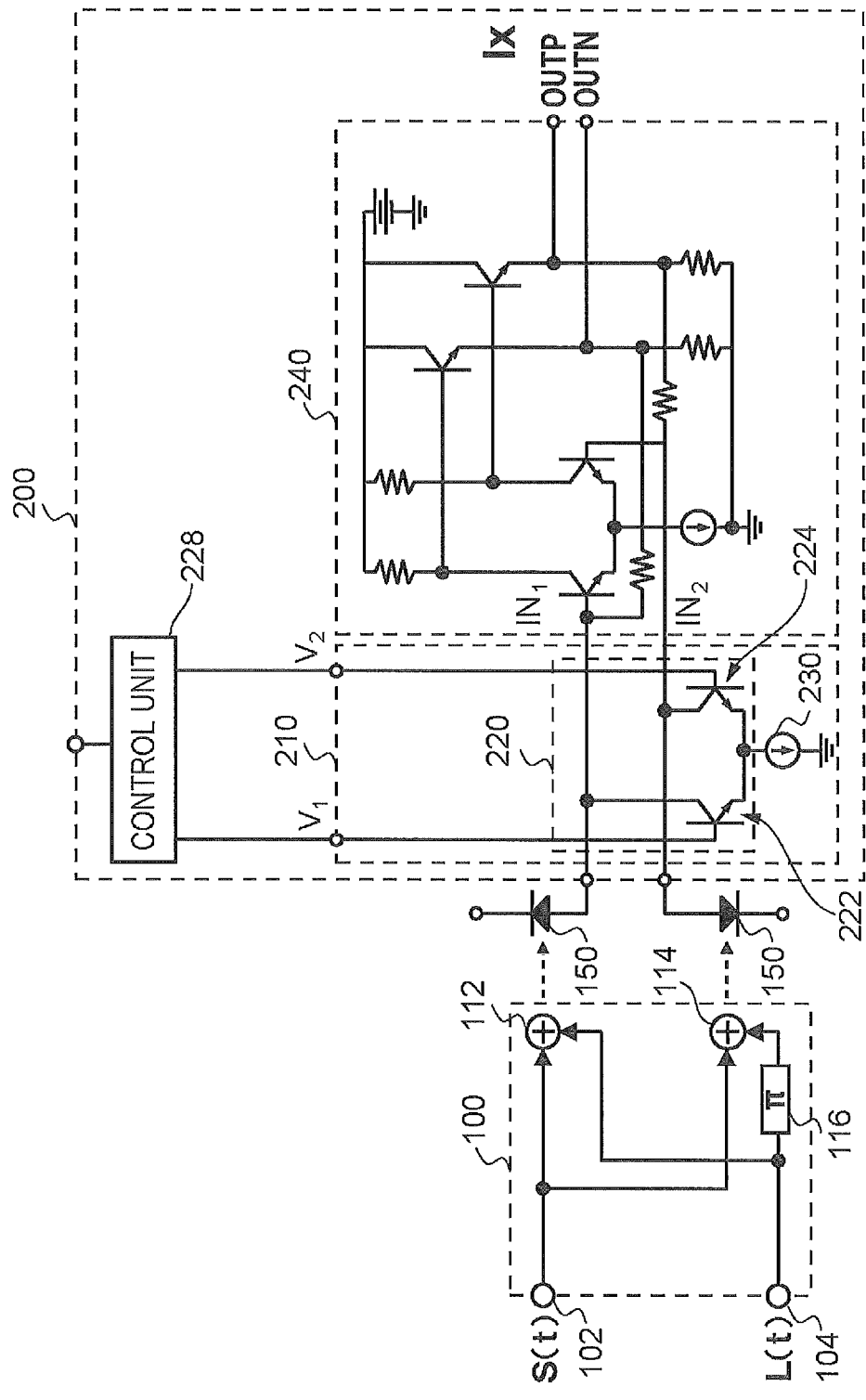
FIG. 2 is a diagram illustrating the details of a configuration of a direct-current component correction unit.

FIG. 2 is a diagram illustrating the details of the configuration of the direct-current component correction unit 210 in the differential trans-impedance amplifier 200, together with the optical hybrid 100 and the trans-impedance circuit 240. Meanwhile in the drawing, the optical hybrid 100 is simplified as compared with FIG. 1.

The direct-current component correction unit 210 includes a first transistor 222, a second transistor 224, and a constant current source 230. In an example shown in the drawing, the first transistor 222 and the second transistor 224 are bipolar transistors, but may be field effect transistors such as a MOS transistor. The first transistor 222 and the second transistor 224 constitute a differential circuit 220.

The first transistor 222 is configured so that a collector thereof (a drain in a case of a field effect transistor) is connected to an interconnection that inputs the first electrical signal into the direct-current component correction unit 210, and an emitter thereof (a source in a case of the field effect transistor) is connected to the input side of the constant current source 230. The second transistor 224 is configured so that a collector thereof is connected to an interconnection that inputs the second electrical signal into the direct-current component correction unit 210, and an emitter thereof is connected to the input side of the constant current source 230. The output side of the constant current source 230 is grounded through, for example, a resistor (not shown). Meanwhile, the example of the above-mentioned connection shows a case where the first transistor 222 and the second transistor 224 are NPN-type bipolar transistors. However, the first transistor 222 and the second transistor 224 may be PNP-type bipolar transistors. In this case, it is possible to obtain the same effect as that in the above-mentioned example by appropriately changing a design.

Meanwhile, the direct-current component correction unit 210 of the differential trans-impedance amplifier 202 also has the same configuration as that of the direct-current component correction unit 210 of the differential trans-impedance amplifier 200, except that the third electrical signal is input into the collector of the first transistor 222, and that the fourth electrical signal is input into the collector of the second transistor 224.

In addition, the trans-impedance circuit 240 includes a differential amplifier, two emitter follower circuits, and two feedback resistors.

Figure 16:
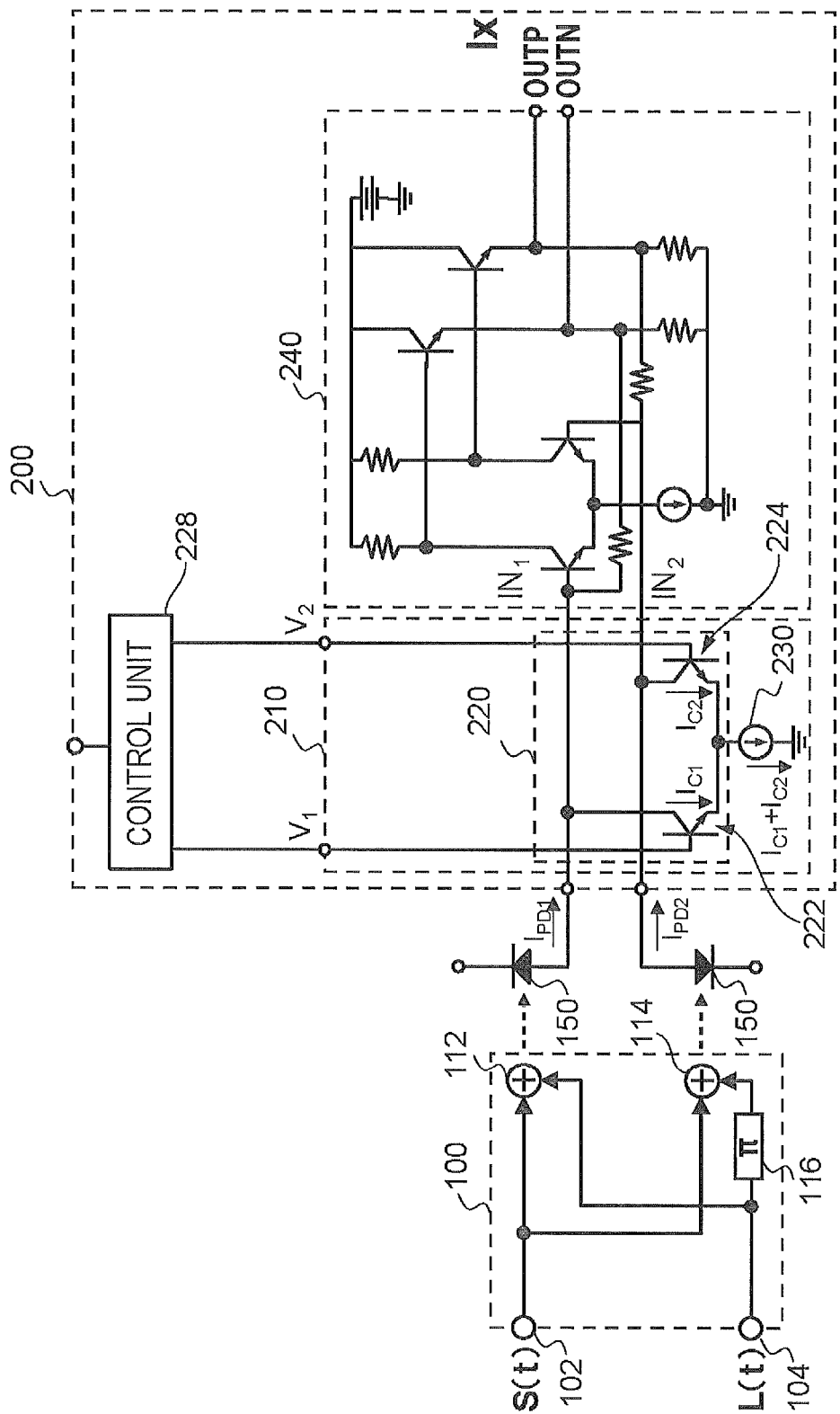
FIG. 16 is a diagram illustrating an operation of the first embodiment.

Next, the operation of the direct-current component correction unit 210 will be described with reference to FIG. 16.

When a direct-current component $I_{PD1}$ of the first electrical signal and a direct-current component $I_{PD2}$ of the second electrical signal are equal to each other, an input control voltage (base) $V_1$ to the first transistor 222 and an input control voltage (base) $V_2$ to the second transistor 224 are set to be the same potential using a control unit 228. Thereby, a current $I_{c1}$ flowing through the first transistor 222 and a current $I_{c2}$ flowing through the second transistor 224 become equal to each other. In this case, a direct-current component of the first electrical signal (IPD1−Ic1) and a direct-current component of the second electrical signal (IPD2−Ic2), which are input into the trans-impedance circuit 240, become equal to each other.

On the other hand, when the direct-current component $I_{PD1}$ of the first electrical signal and the direct-current component $I_{PD2}$ of the second electrical signal are different from each other (for example, $I_{PD1}>I_{PD2}$), the input control voltage (base) $V_1$ to the first transistor 222 is set to be higher than the input control voltage (base) $V_2$ to the second transistor 224, using the control unit 228. Thereby, the current $I_{c1}$ flowing through the first transistor 222 becomes larger than the current $I_{c2}$ flowing through the second transistor 224 ($I_{C1}>I_{C2}$). Thereby, the difference between the direct-current component of the first electrical signal (IPD1−Ic1) and the direct-current component of the second electrical signal (IPD2−Ic2), which are input into the trans-impedance circuit 240, is reduced.

Figure 13:
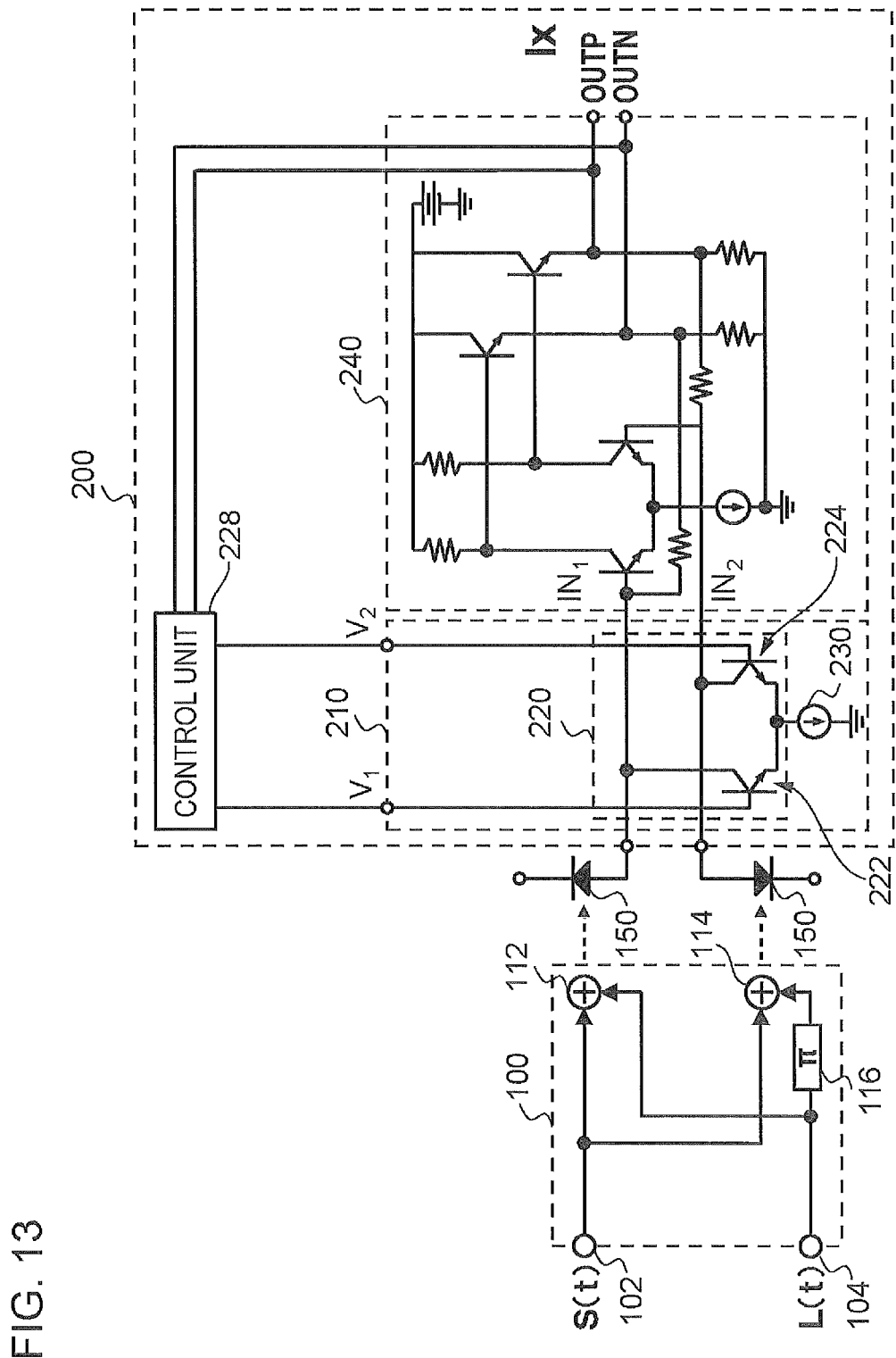
FIG. 13 is a diagram illustrating a configuration of a modified example of the direct-current component correction unit according to the first embodiment.
Figure 14:
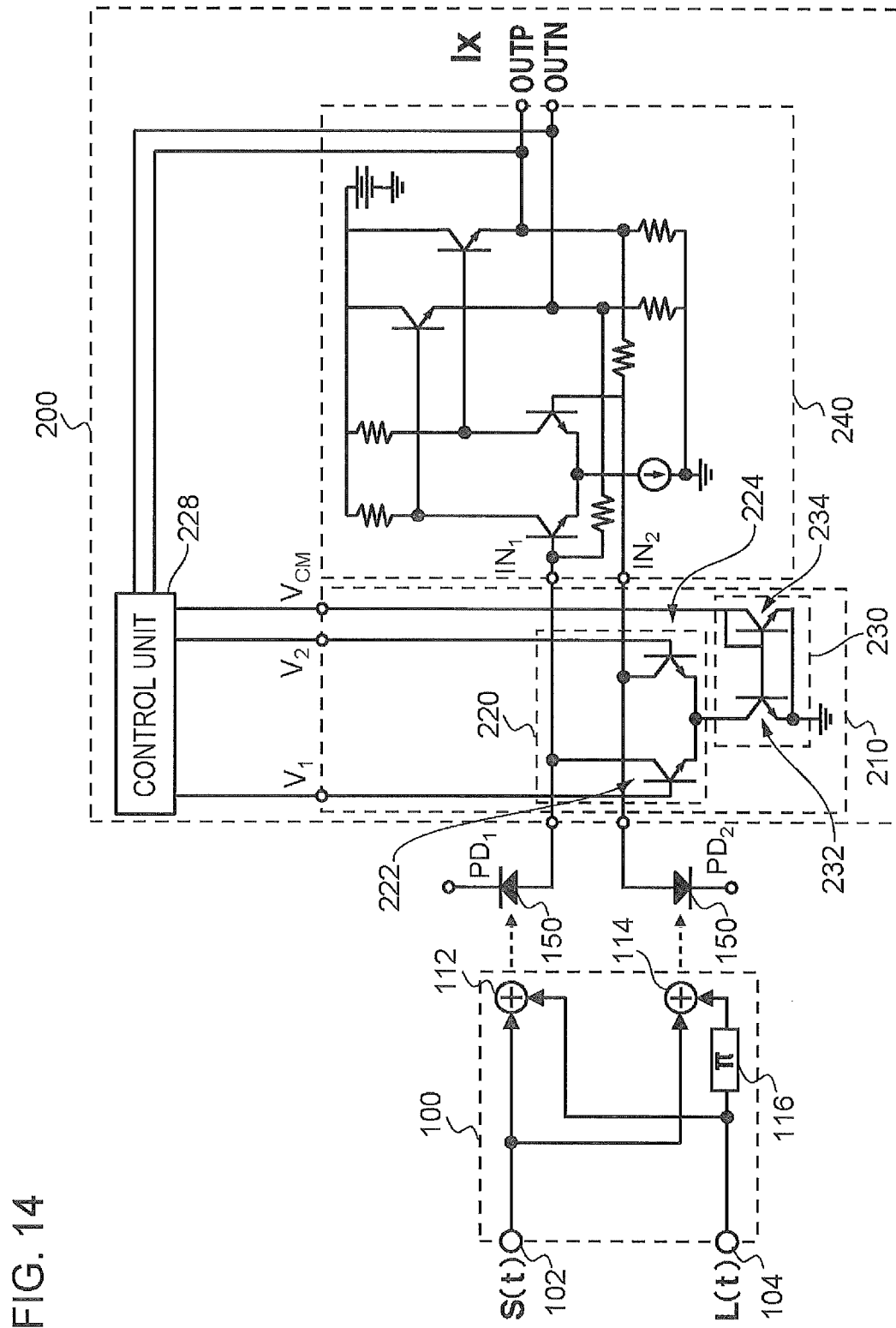
FIG. 14 is a diagram illustrating a configuration of a modified example of the direct-current component correction unit according to the second embodiment.

Meanwhile, in the embodiment, the control unit 228 may be included as shown in FIG. 13. The control unit 228 controls the input control voltage of the first transistor 222 and the input control voltage of the second transistor 224, on the basis of potentials of two output signals of the trans-impedance circuit 240 (differential signals). Specifically, the control unit 228 controls the control voltage of the first transistor 222 on the basis of a potential of a first output of the trans-impedance circuit 240 (P signal), and controls the control voltage of the second transistor 224 on the basis of a potential of a second output of the trans-impedance circuit 240 (N signal).

However, the operation of the direct-current component correction unit 210 according to the embodiment is not limited only to the feedback control of the output of the trans-impedance circuit 240. The first transistor 222 and the second transistor 224 may operate through the control unit 228 in accordance with a detection value based on another detection method or an input from the outside. However, even in this case, the details of the control by the control unit 228 are as described with reference to FIG. 16.

Figure 3:
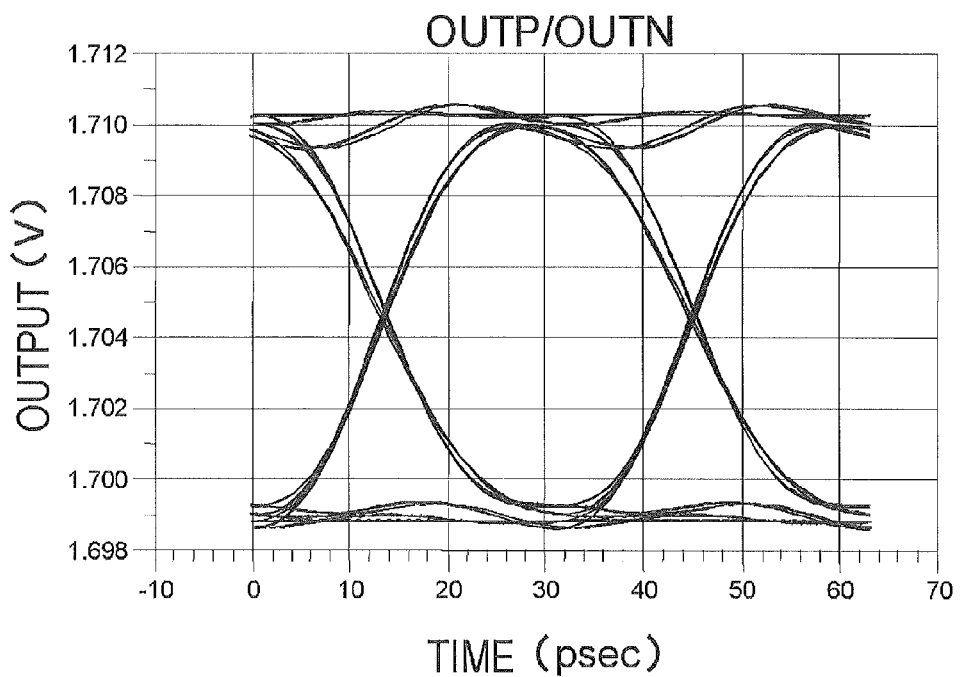
FIG. 3 is a diagram illustrating a first effect of the direct-current component correction unit.
Figure 4:
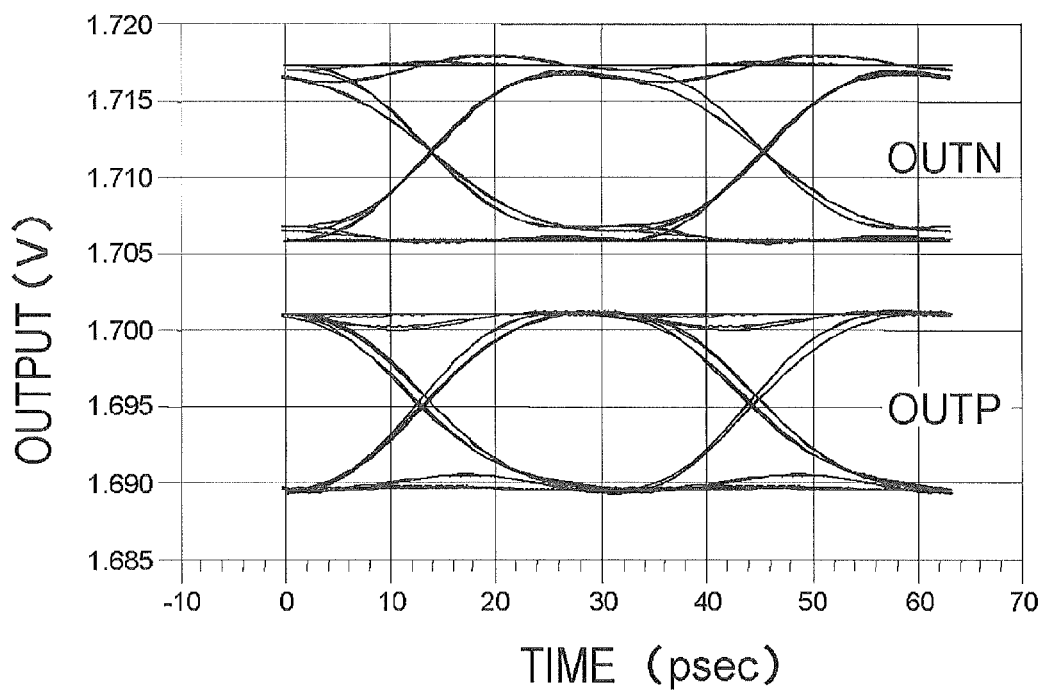
FIG. 4 is a diagram illustrating the first effect of the direct-current component correction unit.

FIG. 3 shows an example of waveforms of output signals after the demodulation by the trans-impedance circuit 240 in a case using a QPSK scheme in which the received optical signal is 31.78911 Gb/s. FIG. 4 shows an example of output waveforms of the trans-impedance circuit 240 without the direct-current component correction unit 210. Comparing these examples, it is determined that a current difference is corrected by providing the direct-current component correction unit 210, and accordingly the output waveforms of the trans-impedance circuit 240 become satisfactory.

Figure 5:
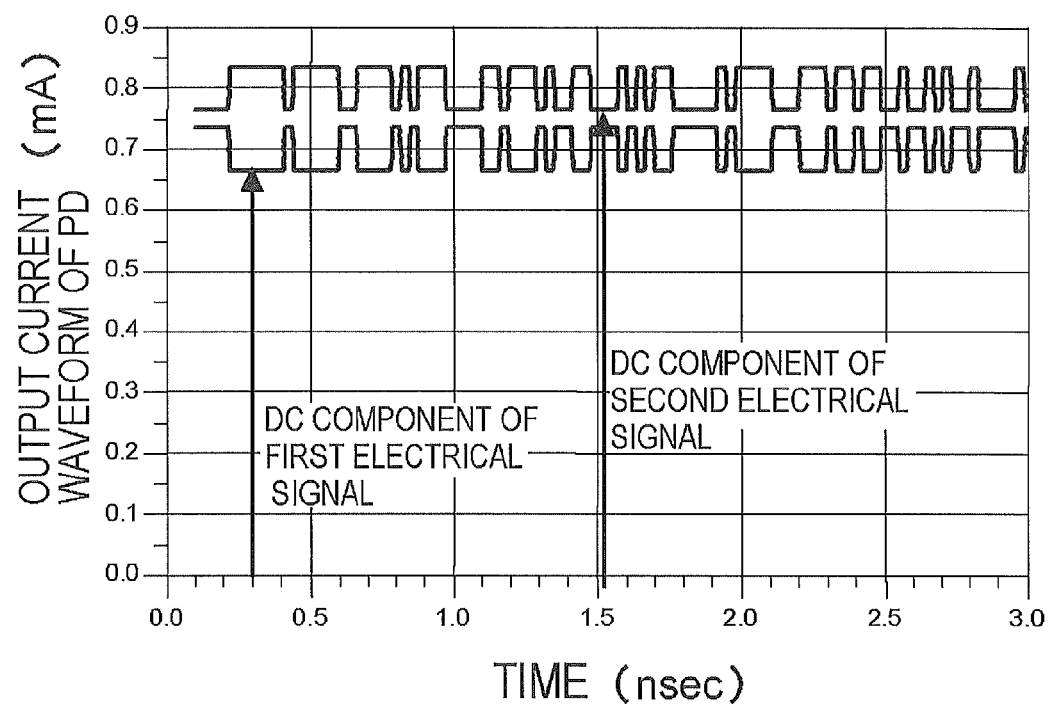
FIG. 5 is a diagram illustrating a second effect of the direct-current component correction unit.
Figure 6:
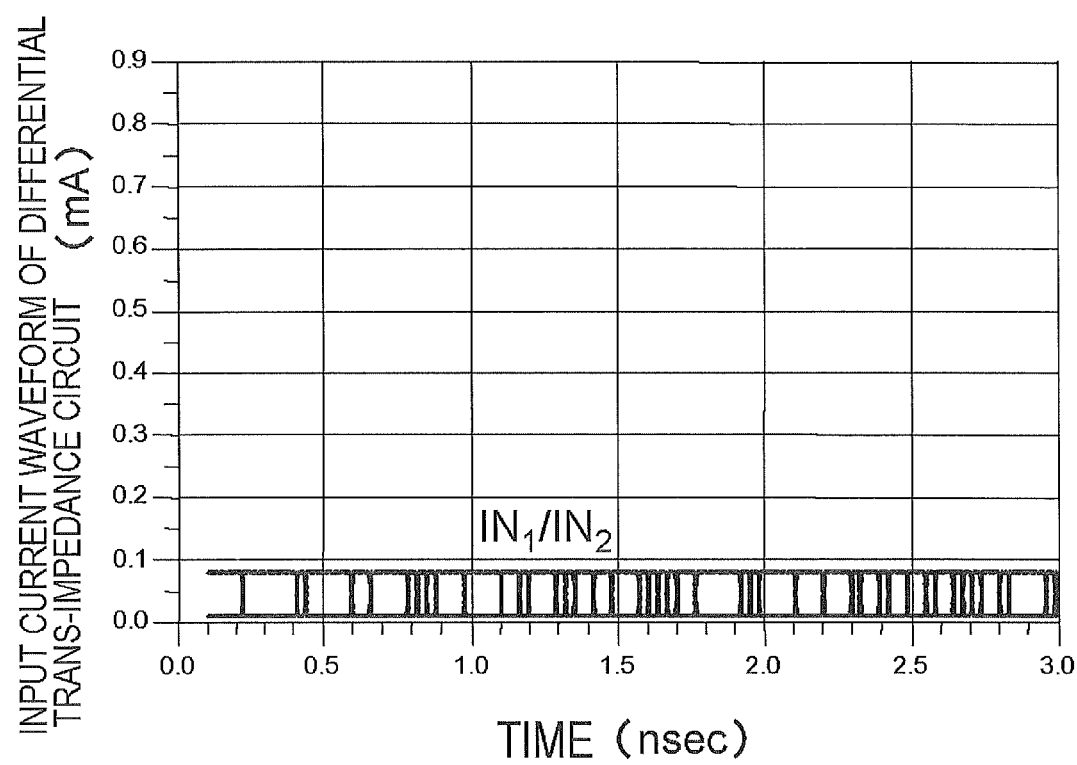
FIG. 6 is a diagram illustrating the second effect of the direct-current component correction unit.

In addition, as shown in FIG. 5, when the direct-current component of an electrical signal is large, the trans-impedance circuit 240 for the electrical signal is required to have a large input dynamic range. On the other hand, according to the embodiment, as shown in FIG. 6, the first transistor 222 and the second transistor 224 are controlled, thereby the direct-current component of each the first electrical signal and the second electrical signal can be reduced (possibly each of them can be set to 0 depending on the configuration of the direct-current component correction unit 210). Thereby, it is possible to reduce the input dynamic range that the trans-impedance circuit 240 is required to have.

Figure 18:
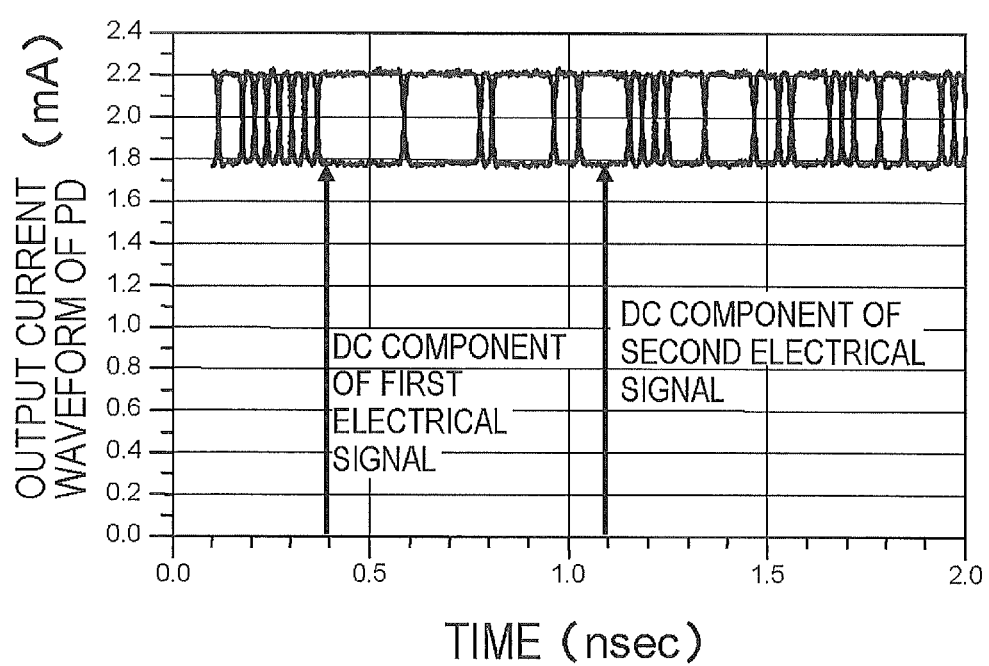
FIG. 18 is a diagram illustrating an effect of the first embodiment.

This effect will be described in detail with reference to FIG. 18. FIG. 18 shows a current signal of an output of the photoelectric conversion element 150 in a case where the received optical signal is −12 dBm, and the local optical signal is 12 dBm. In this current signal, a modulation signal is 0.4 mApp. On the other hand, the direct-current component is 1.8 mA, and is larger than the modulation signal. Even when such a current signal is input into the trans-impedance circuit 240, it is very difficult to maintain to the linearity of the trans-impedance circuit 240. As a result, distortion occurs in a signal to be demodulated.

Figure 17:
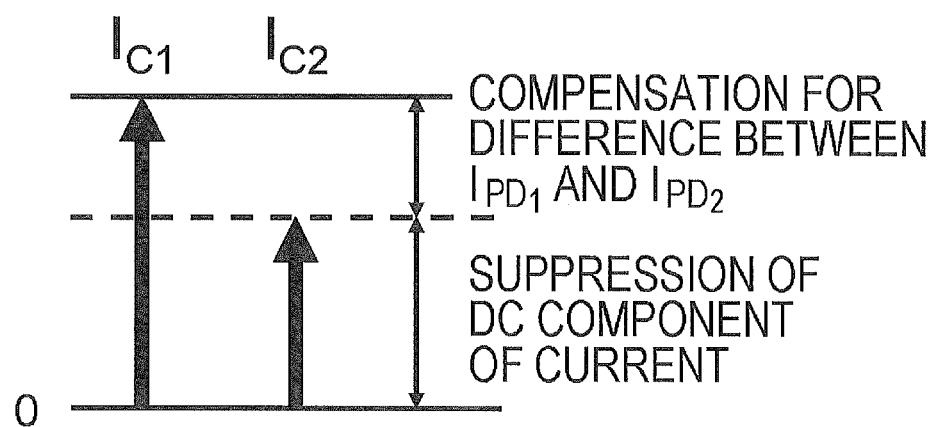
FIG. 17 is a diagram illustrating an operation of the first embodiment.

On the other hand, according to the embodiment, a direct-current component in FIG. 18 is caused to be reduced, and thus the ratio of the modulation signal to the direct-current component can be increased. Therefore, it is possible to maintain the linearity of the trans-impedance circuit 240. In order to express these effects, FIG. 17 shows a relationship between the currents $I_{c1}$ and $I_{c2}$ flowing through the first transistor 222 and the second transistor 224. The difference between Ic1 and Ic2 compensates for the difference between the DC currents of IPD1 and IPD2, and an excessive DC current of the PD is suppressed by the same current value of $I_{c1}$ and $I_{c2}$.

Figure 7:
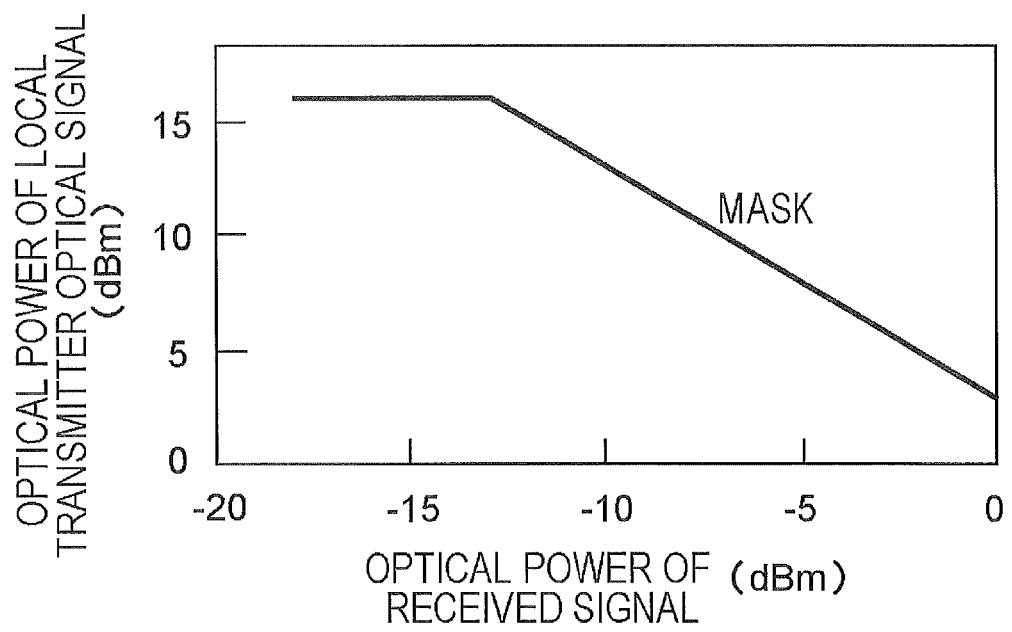
FIG. 7 is a diagram illustrating a relationship between optical powers of a received optical signal and local light which is defined by the Standard Committee of OIF.

FIG. 7 shows a relationship between optical powers of the received optical signal and the local light which is defined by the Standard Committee of Optical Internetworking Forum (OIF). It shows that the optical power of the local light is more than 10 times that of the received optical signal. Since a coherent receiver needs to have high linearity, a differential trans-impedance amplifier is required to have a wide input dynamic range. In the embodiment, as mentioned above, it is possible to reduce a dynamic range that the trans-impedance circuit 240 is required to have.

Second Embodiment

Figure 8:
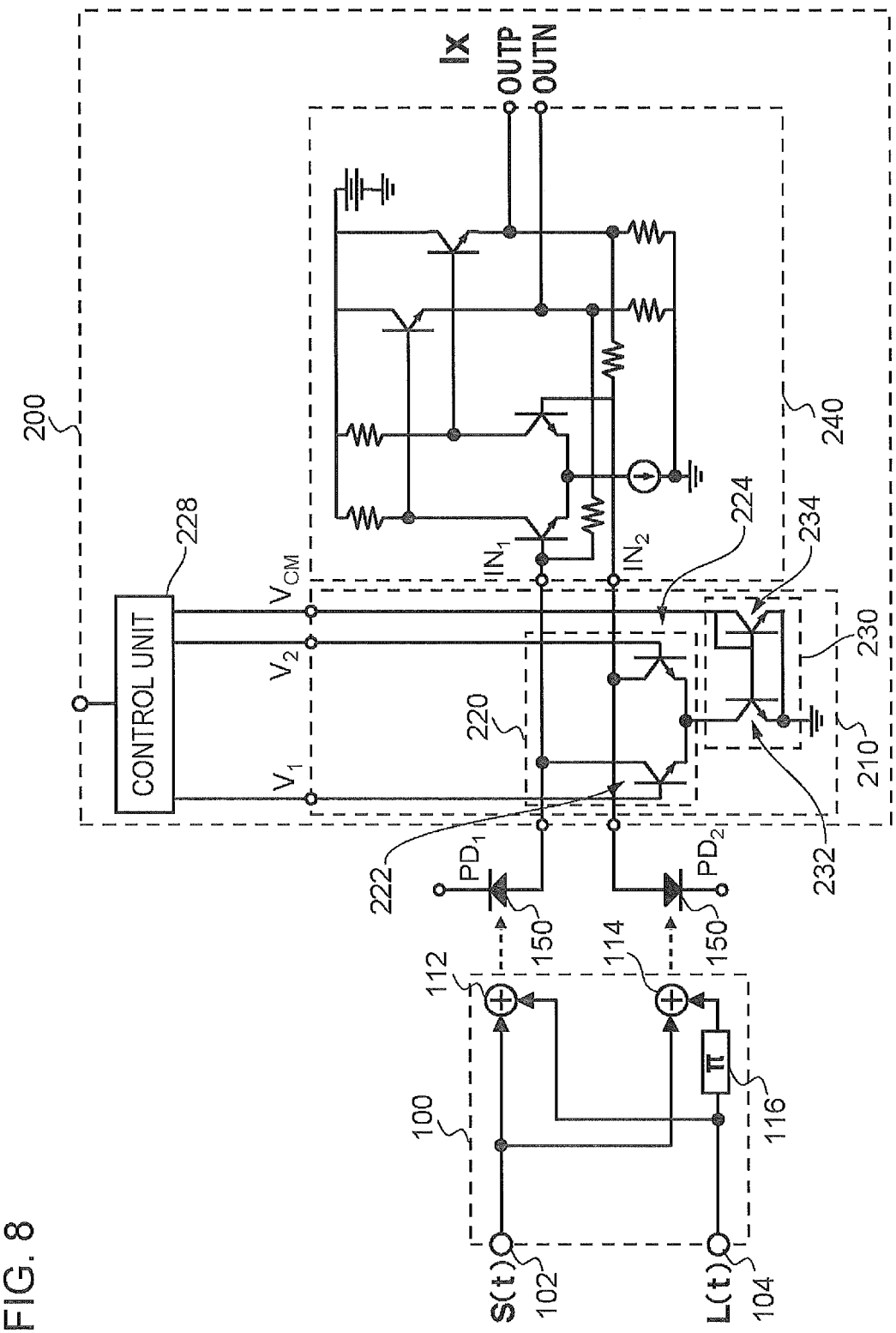
FIG. 8 is a diagram illustrating a configuration of a direct-current component correction unit according to a second embodiment.

FIG. 8 is a diagram illustrating a configuration of the direct-current component correction unit 210 used in the optical signal processing device 10 according to a second embodiment. The optical signal processing device 10 according to the embodiment has the same configuration as that of the direct-current component correction unit 210 according to the first embodiment shown in FIG. 2, except that the constant current source 230 of the direct-current component correction unit 210 is a current mirror circuit.

This current mirror circuit includes transistors 232 and 234. The transistors 232 and 234 are, for example, bipolar transistors, but may be field effect transistors. A base of the transistor 234 is connected to a collector. A collector of the transistor 232 is connected to the emitters of the first transistor 222 and the second transistor 224, and the collector of the transistor 234 is connected to the outside.

In the embodiment, it is also possible to obtain the same effect as that in the first embodiment. In addition, in the embodiment, an input to the collector of the transistor 234 of the current mirror circuit is controlled, thereby allowing the direct-current components of the first electrical signal and the second electrical signal to be reduced. Therefore, it is possible to particularly reduce the size of the dynamic range that the trans-impedance circuit 240 is required to have.

Meanwhile, in the embodiment, the control unit 228 may also be included as shown in the drawing. Note that, in the direct-current component correction unit 210, similarly to the direct-current component correction unit 210 according to the first embodiment, the first transistor 222 and the second transistor 224 may operate not only with the feedback control from the output of the trans-impedance circuit 240, but also with another detection method or the control unit 228 from the outside. The details of the control are as described with reference to FIGS. 16 and 17.

Third Embodiment

Figure 9:
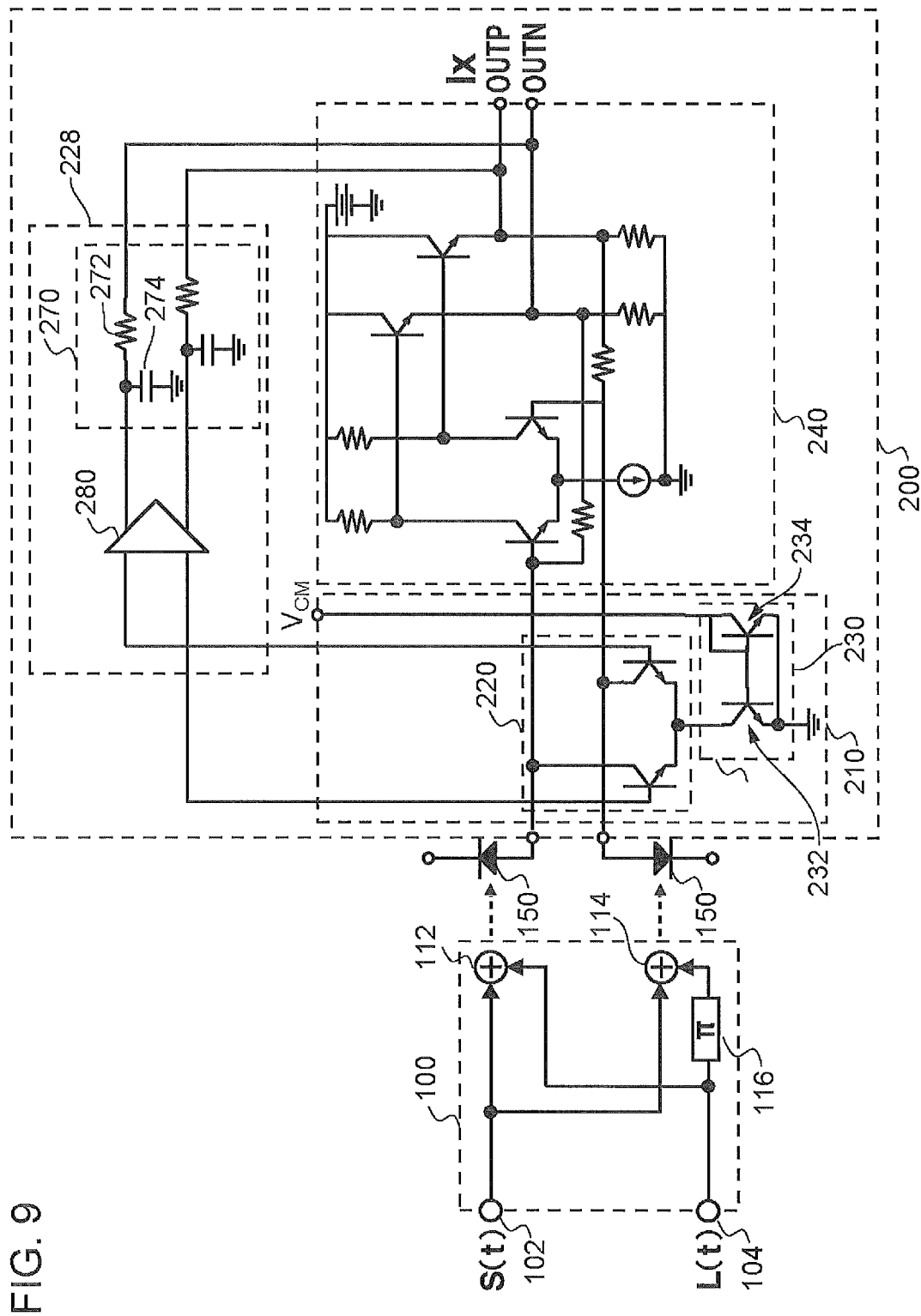
FIG. 9 is a diagram illustrating a configuration of a direct-current component correction unit according to a third embodiment.

FIG. 9 is a diagram illustrating a configuration of the control unit 228 of the optical signal processing device 10 according to a third embodiment, together with another configuration of the direct-current component correction unit 210 and the trans-impedance circuit 240. The optical signal processing device 10 according to the embodiment has the same configuration as that of the optical signal processing device 10 according to the second embodiment, except for the configuration of the control unit 228.

The control unit 228 according to the embodiment includes an integration unit 270 and a level conversion unit 280. The integration unit 270 includes two integration circuits. These two integration circuits integrate each of two output signals of the trans-impedance circuit 240, and detect a potential of each of the output signals. The level conversion unit 280 converts each of the output levels of the two integration circuits. Two outputs of the level conversion unit 280 are input into the collector of the first transistor 222 and the collector of the second transistor 224, respectively.

An effect of the optical signal processing device 10 according to the embodiment will be described below. When the direct-current component $I_{PD1}$ of the first electrical signal and the direct-current component $I_{PD2}$ of the second electrical signal are equal to each other ($I_{PD1}=I_{PD2}$), correction signals having the same level are output to outputs OUTP and OUTN of the trans-impedance circuit 240. For this reason, the input control voltage (base) to the first transistor 222 and the input control voltage (base) to the second transistor 224 are set to the same potential through the level conversion circuit 280. Thereby, the current $I_{c1}$ flowing through the first transistor 222 and the current $I_{c2}$ flowing through the second transistor 224 become equal to each other. In this case, the direct-current component of the first electrical signal (IPD1−Ic1) and the direct-current component of the second electrical signal (IPD2−Ic2) which are input into the trans-impedance circuit 240 become equal to each other.

In addition, a voltage terminal $V_{CM}$ of the current mirror circuit 230 is adjusted, thereby allowing the direct-current components of the first electrical signal and the second electrical signal, which are input into the trans-impedance circuit 11, to be reduced to 0. In this manner, it is possible to obtain the sufficient input dynamic range of the trans-impedance circuit 240.

On the other hand, when a difference occurs between the direct-current component $I_{PD1}$ of the first electrical signal and the direct-current component $I_{PD2}$ of the second electrical signal (for example, $I_{PD1}>I_{PD2}$) normally, correction signals having different levels are output to the outputs OUTP and OUTN of the trans-impedance circuit 240. These are detected by the integration circuit 20.

The difference between the levels detected by the integration circuit 270 is converted to have a proper voltage range through the level conversion circuit 280. Each of the input control voltage (base) to the first transistor 222 and the input control voltage (base) of the second transistor 224 are set to proper values according to the level difference after the conversion. The relation between the current $I_{c1}$ flowing through the first transistor 222 and the current $I_{c2}$ flowing through the second transistor 224 becomes $I_{c1}>I_{c2}$. The above-mentioned operation is repeated until the levels of the outputs OUTP and OUTN of the trans-impedance circuit 240 become the same as each other. As a result, signals of which the direct-current component of the first electrical signal (IPD1−Ic1) and the direct-current component of the second electrical signal (IPD2−Ic2) are the same as each other are automatically input to the trans-impedance circuit 240.

In the embodiment, it is also possible to obtain the same effect as that in the second embodiment.

Fourth Embodiment

Figure 10:
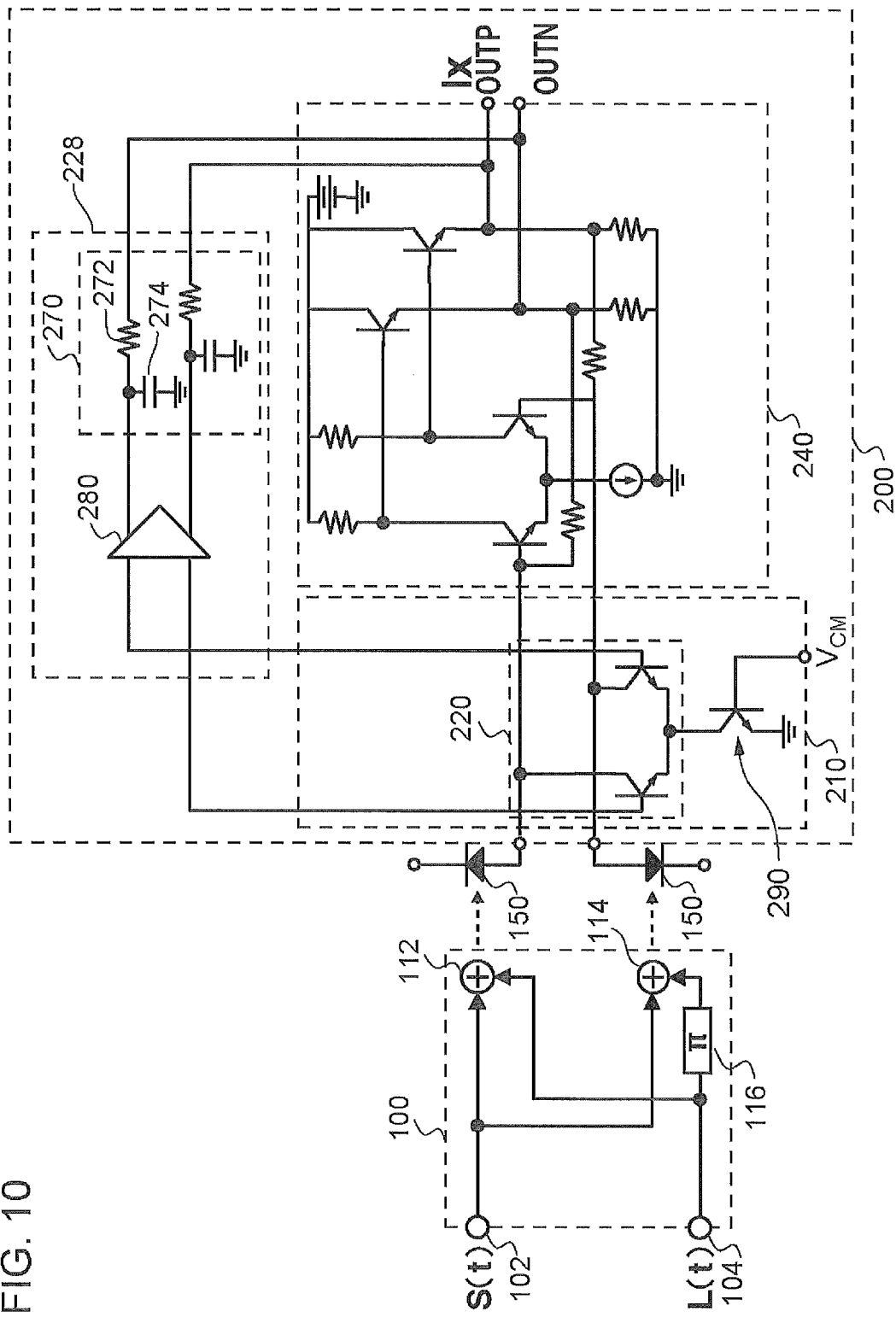
FIG. 10 is a diagram illustrating a configuration of a direct-current component correction unit according to a fourth embodiment.

FIG. 10 is a diagram illustrating a configuration of the differential trans-impedance amplifier 200 of the optical signal processing device 10 according to a fourth embodiment. The differential trans-impedance amplifier 200 according to the embodiment has the same configuration as that of the optical signal processing device 10 according to the third embodiment, except that the constant current source 230 of the direct-current component correction unit 210 is a third transistor 290. Meanwhile, in the embodiment and all the other embodiments, it is also possible to replace a bipolar transistor with a field effect transistor.

Meanwhile, the differential trans-impedance amplifier 202 shown in FIG. 1 also has the same configuration as that of the differential trans-impedance amplifier 200.

In the embodiment, it is possible to obtain the same effect as that in the third embodiment.

Fifth Embodiment

Figure 11:
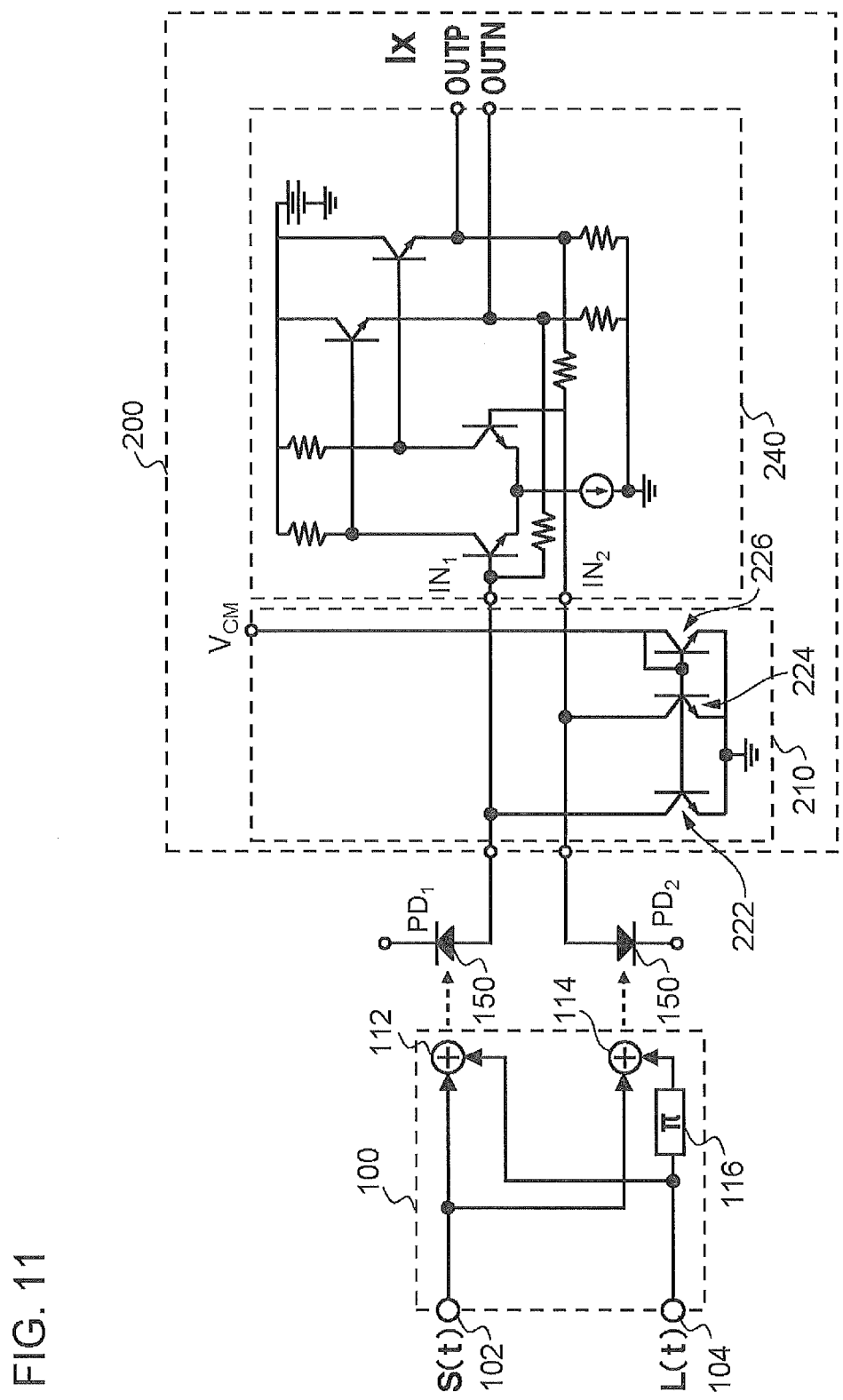
FIG. 11 is a diagram illustrating of a configuration of a direct-current component correction unit according to a fifth embodiment.

FIG. 11 is a diagram illustrating a configuration of the direct-current component correction unit 210 of the optical signal processing device 10 according to a fifth embodiment, together with the configuration of the trans-impedance circuit 240. The optical signal processing device 10 according to the embodiment has the same configuration as that of the optical signal processing device 10 according to the first embodiment, except that the differential trans-impedance amplifier 200 does not include the control unit 228, and that the direct-current component correction unit 210 has a different configuration.

The direct-current component correction unit 210 includes the first transistor 222, the second transistor 224, and a fourth transistor 226. In the embodiment, the same signal is input into a base of the first transistor 222 and a base of the second transistor 224 from the control unit 228. In addition, a base and a collector of the fourth transistor 226 are connected to the base of the second transistor 224. Emitters of the first transistor 222, the second transistor 224, and the fourth transistor 226 are all grounded through, for example, a resistor (not shown).

According to the embodiment, inputs to the base of the first transistor 222, the base of the second transistor 224, and the collector of the fourth transistor 226 are controlled, thereby allowing each of the direct-current components of the first electrical signal and the second electrical signal which are input into the trans-impedance circuit 240 to be reduced. Thereby, it is possible to reduce the dynamic range that the trans-impedance circuit 240 is required to have.

Sixth Embodiment

Figure 12:
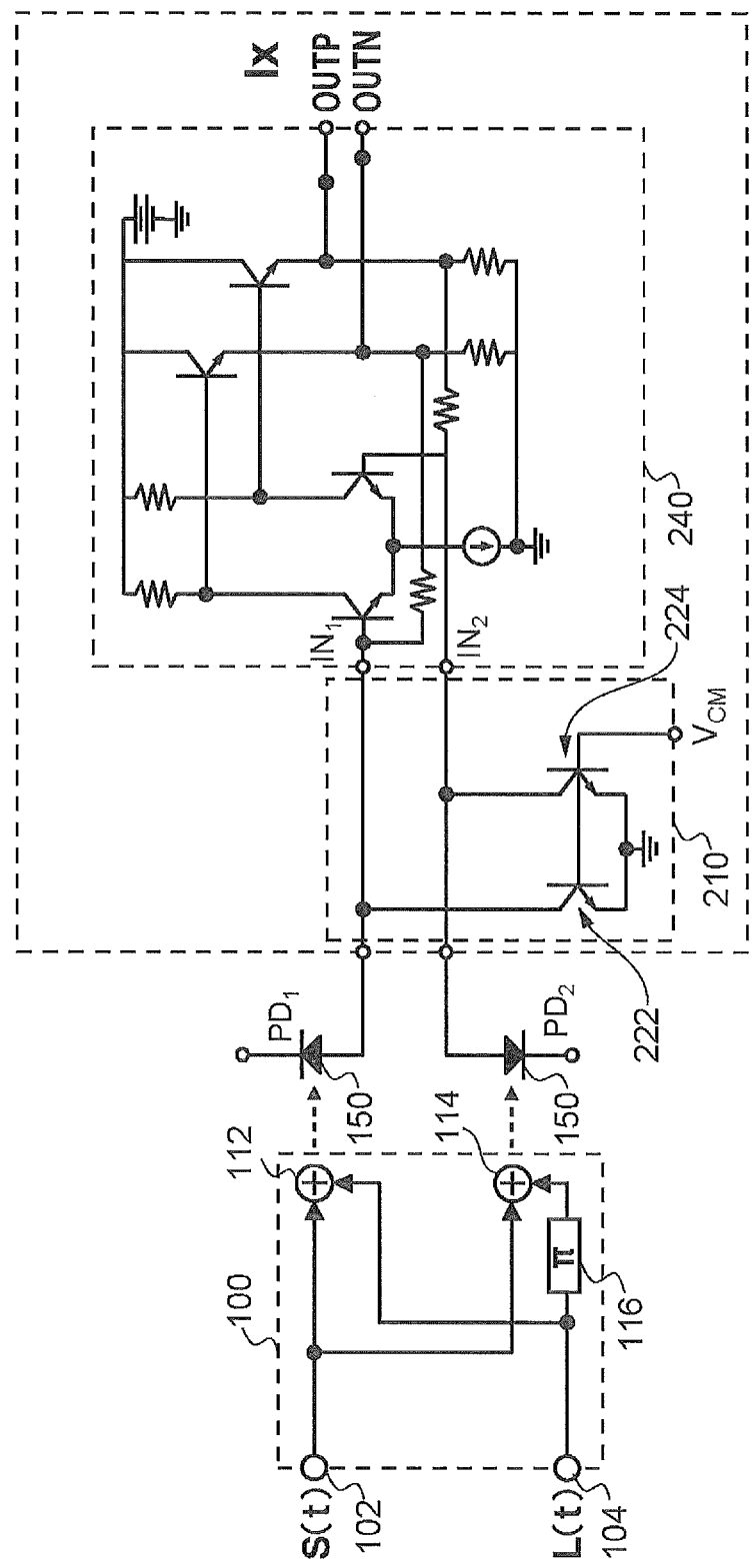
FIG. 12 is a diagram illustrating a configuration of a direct-current component correction unit according to a sixth embodiment.

FIG. 12 is a diagram illustrating a configuration of the direct-current component correction unit 210 of the optical signal processing device 10 according to a sixth embodiment, together with the configuration of the trans-impedance circuit 240. The optical signal processing device 10 according to the embodiment has the same configuration as that of the optical signal processing device 10 according to the fifth embodiment, except that the differential trans-impedance amplifier 200 does not include the control unit 228, and that the direct-current component correction unit 210 does not include the fourth transistor 226.

In the embodiment, it is also possible to obtain the same effect as that in the fifth embodiment.

Seventh Embodiment

Figure 15:
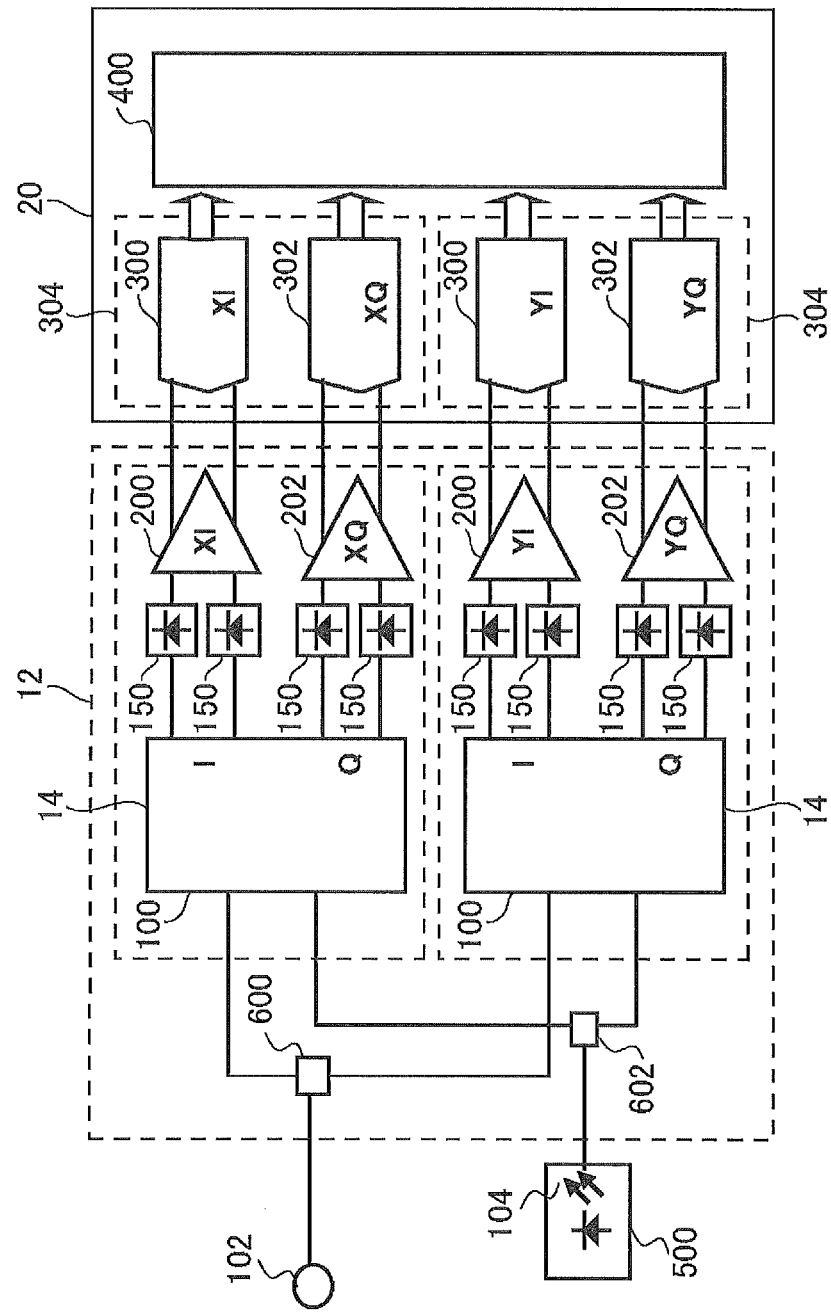
FIG. 15 is a diagram illustrating a configuration of an optical signal processing device according to a seventh embodiment.

FIG. 15 is a diagram illustrating a configuration of an optical signal processing device according to a seventh embodiment. The optical signal processing unit according to the embodiment is an optical signal processing unit that receives an optical signal using a digital coherent scheme. This optical signal processing unit includes an optical signal processing device 12, an electrical signal processing device 20, and a local light source 500.

The optical signal processing device 12 includes two signal processing units 14. Both the signal processing units 14 include the optical hybrid 100, four photoelectric conversion elements 150, and differential trans-impedance amplifiers 200 and 202. The optical hybrid 100, the four photoelectric conversion elements 150, and the differential trans-impedance amplifiers 200 and 202 of the signal processing unit 14 have the same configurations as those of the optical hybrid 100, the four photoelectric conversion elements 150, and the differential trans-impedance amplifiers 200 and 202 which are shown in the first to sixth embodiments.

A received signal light which is input into the first input unit 102 of the optical signal processing device 12 is split into an X polarized wave and a Y polarized wave by a polarization beam splitter 600. Each of the X polarized wave and the Y polarized wave are input into the different signal processing units 14.

The local light source 500 is connected to a second input unit 104 of the optical signal processing device 12. The local light source 500 inputs local light to the second input unit 104. The local light input into the second input unit 140 is split into two beams of light by a beam splitter 602. Each of the two beams of light are input into the different signal processing units 14.

The electrical signal processing device 20 includes two AD conversion groups 304 and the digital signal processing unit 400. Both the AD conversion groups 304 include the AD conversion units 300 and 302. A signal is input into the first AD conversion group 304 from the first signal processing unit 14 included in the optical signal processing device 12, and a signal is input into the second AD conversion group 304 from the second signal processing unit 14 included in the optical signal processing device 12. The digital signal processing unit 400 processes outputs from the two AD conversion groups 304, and generates a demodulated signal.

In the embodiment, it is also possible to obtain the same effects as that in first to sixth embodiments.

As described above, although the embodiments of the invention have been set forth with reference to the drawings, they are merely illustrative of the invention, and various configurations other than stated above can be adopted.

This application claims priority to Japanese Patent Application No. 2011-208714 filed on Sep. 26, 2011, the content of which is incorporated herein by reference in its entirety.

The invention claimed is:

1. An optical signal processing device comprising:
a first optical signal generation unit that generates a first optical signal by causing a received optical signal and a local optical signal to interfere with each other with a first phase difference;
a second optical signal generation unit that generates a second optical signal by causing the received optical signal and the local optical signal to interfere with each other with a second phase difference shifted by $\pi$ from the first phase difference;
a first photoelectric conversion element that converts the first optical signal into a first electrical signal;
a second photoelectric conversion element that converts the second optical signal into a second electrical signal;
a direct-current component correction unit that reduces a difference between a magnitude of a direct-current component of the first electrical signal and a magnitude of a direct-current component of the second electrical signal; and
a differential trans-impedance circuit into which the first electrical signal and the second electrical signal, which have been corrected by the direct-current component correction unit, are input.

2. The optical signal processing device according to claim 1, wherein the direct-current component correction unit includes:
a first transistor which is connected between the first photoelectric conversion element and the trans-impedance circuit;
a second transistor which is connected between the second photoelectric conversion element and the trans-impedance circuit; and
a constant current source which is connected between the first photoelectric conversion element and the trans-impedance circuit through the first transistor, and connected between the second photoelectric conversion element and the trans-impedance circuit through the second transistor.

3. The optical signal processing device according to claim 2, further comprising a control unit that controls a control voltage of the first transistor and a control voltage of the second transistor,
   wherein the control unit controls the control voltage of the first transistor and the control voltage of the second transistor, on the basis of two output signals of the trans-impedance circuit.

4. The optical signal processing device according to claim 3, wherein the control unit includes:
   two integration circuits that integrate the two output signals of the trans-impedance circuit, respectively; and
   a level conversion unit that converts an output level of each of the two integration circuits, and
   wherein two outputs of the level conversion unit are input as a gate voltage of the first transistor and a gate voltage of the second transistor.

5. The optical signal processing device according to claim 3, wherein the constant current source includes a current mirror circuit.

6. The optical signal processing device according to claim 5, wherein the control unit controls the current mirror circuit.

7. The optical signal processing device according to claim 1, wherein the direct-current component correction unit includes:
   a first transistor which is connected between the first photoelectric conversion element and the trans-impedance circuit;
   a second transistor which is connected between the second photoelectric conversion element and the trans-impedance circuit;
   a third transistor which is connected between the first photoelectric conversion element and the trans-impedance circuit through the first transistor, and connected between the second photoelectric conversion element and the trans-impedance circuit through the second transistor; and
   a control unit that controls a control voltage of the first transistor and a control voltage of the second transistor.

8. The optical signal processing device according to claim 1, further comprising an AD conversion unit that converts two output signals of the trans-impedance circuit into a digital signal.

9. The optical signal processing device according to claim 1, wherein the direct-current component correction unit reduces each of the direct-current components of the first electrical signal and the second electrical signal.

10. The optical signal processing device according to claim 1, wherein the first phase difference is 0 or $\pi/2$.

11. The optical signal processing device according to claim 1, wherein said differential trans-impedance circuit comprises:
   a differential amplifier which receives the first electrical signal and the second electrical signal;
   a plurality of emitter follower circuits connected to the differential amplifier; and
   a plurality of feedback resistors connected to the differential amplifier.

12. The optical signal processing device according to claim 2,
   wherein said first transistor and said second transistor comprise field effect transistors,
   wherein a drain of the first transistor is connected to an interconnection that inputs the first electrical signal into the direct-current component correction unit, and
   wherein a source of the first transistor is connected to an input side of the constant current source.

13. The optical signal processing device according to claim 2,
   wherein said first transistor and said second transistor comprise bipolar transistors,
   wherein a collector of the first transistor is connected to an interconnection that inputs the first electrical signal into the direct-current component correction unit, and
   wherein an emitter of the first transistor is connected to an input side of the constant current source.

14. An optical signal processing device comprising:
   a first optical signal processing unit that generates a first digital signal by causing a received optical signal and a local optical signal to interfere with each other under a first condition;
   a second optical signal processing unit that generates a second digital signal by causing the received optical signal and the local optical signal to interfere with each other under a second condition; and
   a digital processing unit that processes the first digital signal and the second digital signal and extracts a signal included in the received optical signal,
   wherein the first optical signal processing unit includes:
      a first optical signal generation unit that generates a first optical signal by causing the received optical signal and the local optical signal to interfere with each other with a same phase;
      a second optical signal generation unit that generates a second optical signal by causing the received optical signal and the local optical signal to interfere with each other with a phase difference of $\pi$;
      a first photoelectric conversion element that converts the first optical signal into a first electrical signal;
      a second photoelectric conversion element that converts the second optical signal into a second electrical signal;
      a first direct-current component correction unit that reduces a difference between a direct-current component of the first electrical signal and a direct-current component of the second electrical signal;
      a differential first trans-impedance circuit into which the first electrical signal and the second electrical signal, which have been corrected by the first direct-current component correction unit, are input; and
      a first AD conversion unit that converts an output of the first trans-impedance circuit into the first digital signal, and
   the second optical signal processing unit includes:
      a third optical signal generation unit that generates a third optical signal by causing the received optical signal and the local optical signal to interfere with each other with a phase difference of $\pi/2$;
      a fourth optical signal generation unit that generates a fourth optical signal by causing the received optical signal and the local optical signal to interfere with each other with a phase difference of $3\pi/2$;
      a third photoelectric conversion element that converts the third optical signal into a third electrical signal;
      a fourth photoelectric conversion element that converts the fourth optical signal into a fourth electrical signal;
      a second direct-current component correction unit that reduces a difference between a direct-current component of the third electrical signal and a direct-current component of the fourth electrical signal;
      a differential second trans-impedance circuit into which the third electrical signal and the fourth electrical signal, which have been corrected by the second direct-current component correction unit, are input; and a second AD conversion unit that converts an output of the second trans-impedance circuit into the second digital signal.

15. The optical signal processing device according to claim 14, wherein both the first direct-current component correction unit and the second direct-current component correction unit include:
a first transistor which is connected between the first photoelectric conversion element and a corresponding trans-impedance circuit;
a second transistor which is connected between the second photoelectric conversion element and the corresponding trans-impedance circuit; and
a constant current source which is connected between the first photoelectric conversion element and the corresponding trans-impedance circuit through the first transistor, and connected between the second photoelectric conversion element and the corresponding trans-impedance circuit through the second transistor.

16. The optical signal processing device according to claim 15, further comprising a control unit that controls a control voltage of the first transistor and a control voltage of the second transistor,
wherein the control unit controls the control voltage of the first transistor and the control voltage of the second transistor, on the basis of two output signals of the corresponding trans-impedance circuit.

17. The optical signal processing device according to claim 16, wherein the control unit includes:
two integration circuits that integrate the two output signals of the corresponding trans-impedance circuit, respectively; and
a level conversion unit that converts an output level of each of the two integration circuits, and
wherein two outputs of the level conversion unit are input as a gate voltage of the first transistor and a gate voltage of the second transistor.

18. The optical signal processing device according to claim 15, wherein the constant current source includes a current mirror circuit.

19. The optical signal processing device according to claim 18, further comprising a second control unit that controls the current mirror circuit.

20. The optical signal processing device according to claim 14,
wherein the first direct-current component correction unit reduces each of the direct-current components of the first electrical signal and the second electrical signal, and
wherein the second direct-current component correction unit reduces each of the direct-current components of the third electrical signal and the fourth electrical signal.

21. A trans-impedance amplifier comprising:
a direct-current component correction unit that reduces a difference between a magnitude of a direct-current component of a first electrical signal and a magnitude of a direct-current component of a second electrical signal; and
a differential trans-impedance circuit into which the first electrical signal and the second electrical signal, which have been corrected by the direct-current component correction unit, are input; wherein the direct-current component correction unit includes:
a first transistor which is connected between the first photoelectric conversion element and the trans-impedance circuit;
a second transistor which is connected between the second photoelectric conversion element and the trans-impedance circuit; and
a constant current source or a third transistor which is connected between the first photoelectric conversion element and the trans-impedance circuit through the first transistor, and connected between the second photoelectric conversion element and the trans-impedance circuit through the second transistor.

22. An optical signal processing method comprising:
generating a first optical signal by causing a received optical signal and a local optical signal which is output from a light source on a receiving side to interfere with each other with a first phase difference;
generating a second optical signal by causing the received optical signal and the local optical signal to interfere with each other with a second phase difference shifted by $\pi$ from the first phase difference;
converting the first optical signal into a first electrical signal;
converting the second optical signal into a second electrical signal; and
reducing a difference between a direct-current component of the first electrical signal and a direct-current component of the second electrical signal, and then inputting the first electrical signal and the second electrical signal to a differential trans-impedance circuit.

23. An optical signal processing device comprising:
a first optical signal generation unit that generates a first optical signal by causing a received optical signal and a local optical signal to interfere with each other with a first phase difference;
a second optical signal generation unit that generates a second optical signal by causing the received optical signal and the local optical signal to interfere with each other with a second phase difference shifted by $\pi$ from the first phase difference;
a first photoelectric conversion element that converts the first optical signal into a first electrical signal;
a second photoelectric conversion element that converts the second optical signal into a second electrical signal;
a direct-current component correction unit that reduces a direct-current component of the first electrical signal and a direct-current component of the second electrical signal; and
a differential trans-impedance circuit into which the first electrical signal and the second electrical signal, which have been corrected by the direct-current component correction unit, are input.

24. An optical signal processing device comprising:
a first optical signal processing unit that generates a first digital signal by causing a received optical signal and a local optical signal to interfere with each other under a first condition;
a second optical signal processing unit that generates a second digital signal by causing the received optical signal and the local optical signal to interfere with each other under a second condition; and
a digital processing unit that processes the first digital signal and the second digital signal and extracts a signal included in the received optical signal, wherein the first optical signal processing unit includes:
- a first optical signal generation unit that generates a first optical signal by causing the received optical signal and the local optical signal to interfere with each other with a same phase;
- a second optical signal generation unit that generates a second optical signal by causing the received optical signal and the local optical signal to interfere with each other with a phase difference of t;
- a first photoelectric conversion element that converts the first optical signal into a first electrical signal;
- a second photoelectric conversion element that converts the second optical signal into a second electrical signal;
- a first direct-current component correction unit that reduces a direct-current component of the first electrical signal, and reduces a direct-current component of the second electrical signal;
- a differential first trans-impedance amplifier into which the first electrical signal and the second electrical signal, which have been after corrected by the direct-current component correction unit, are input, and
- a first AD conversion unit that converts an output of the first trans-impedance amplifier into the first digital signal, and the second optical signal processing unit includes:
- a third optical signal generation unit that generates a third optical signal by causing the received optical signal and the local optical signal to interfere with each other with a phase difference of $\pi/2$;
- a fourth optical signal generation unit that generates a fourth optical signal by causing the received optical signal and the local optical signal to interfere with each other with a phase difference of $3\pi/2$;
- a third photoelectric conversion element that converts the third optical signal into a third electrical signal;
- a fourth photoelectric conversion element that converts the fourth optical signal into a fourth electrical signal;
- a second direct-current component correction unit that reduces a direct-current component of the third electrical signal, and reduces a direct-current component of the fourth electrical signal;
- a differential second trans-impedance amplifier into which the third electrical signal and the fourth electrical signal, which have been corrected by the direct-current component correction unit, are input; and
- a second AD conversion unit that converts an output of the second trans-impedance amplifier into the second digital signal.

\* \* \* \* \*